(12) United States Patent
Van Acht et al.

(10) Patent No.: US 7,834,668 B2
(45) Date of Patent: Nov. 16, 2010

(54) SINGLE THRESHOLD AND SINGLE CONDUCTIVITY TYPE AMPLIFIER/BUFFER

(75) Inventors: Victor Martinus Gerardus Van Acht, Waalre (NL); Nicolaas Lambert, Waalre (NL); Andrei Mijiritskii, Zaltbommel (NL); Pierre Hermanus Woerlee, Valkenswaard (NL)

(73) Assignee: NXP B.V., Eindhoven (NL)

( * ) Notice: Subject to any disclaimer, the term of this patent is extended or adjusted under 35 U.S.C. 154(b) by 207 days.

(21) Appl. No.: 12/088,735

(22) PCT Filed: Oct. 4, 2006

(86) PCT No.: PCT/IB2006/053633

§ 371 (c)(1),
(2), (4) Date: Apr. 4, 2008

(87) PCT Pub. No.: WO2007/042970

PCT Pub. Date: Apr. 19, 2007

(65) Prior Publication Data

US 2008/0252338 A1 Oct. 16, 2008

(51) Int. Cl.
*H03B 1/00* (2006.01)

(52) U.S. Cl. ...................................... 327/108; 327/390

(58) Field of Classification Search .................. 327/108, 327/112, 390, 589; 326/88
See application file for complete search history.

(56) References Cited

U.S. PATENT DOCUMENTS

| 3,774,055 | A | * | 11/1973 | Bapat | ........................... | 326/97 |
| 4,633,105 | A | | 12/1986 | Tsujimoto | | |
| 4,906,056 | A | | 3/1990 | Taniguchi | | |
| 5,369,320 | A | | 11/1994 | Satani et al. | | |
| 5,512,845 | A | | 4/1996 | Yuh | | |
| 5,949,271 | A | | 9/1999 | Fujikura | | |
| 7,180,356 | B2 | * | 2/2007 | Kanbara et al. | ............. | 327/333 |
| 7,463,072 | B2 | * | 12/2008 | Kim et al. | ................... | 327/112 |

FOREIGN PATENT DOCUMENTS

| EP | 0055136 A2 | 6/1982 |
| WO | 2007034384 A2 | 3/2007 |

* cited by examiner

*Primary Examiner*—Hai L Nguyen

(57) ABSTRACT

An amplifier/buffer composed from circuit elements of a single threshold and single conductivity type, comprising an input stage for receiving one or more inputs for buffering/amplification and providing an intermediate to control output of the amplifier/buffer. The intermediate signal is provided to a boosting circuit configured to boosts said signal when said signal has exceeded a predetermined value. The amplifier/buffer further has an output stage for receiving at least said signal and providing an amplified/buffered output.

6 Claims, 5 Drawing Sheets

SINGLE THRESHOLD AND SINGLE CONDUCTIVITY TYPE AMPLIFIER/BUFFER

The invention relates to an amplifier/buffer, more particularly, the invention relates to an amplifier/buffer having single threshold and single conductivity type circuit elements.

In large circuits, clock and other critical signals that are transmitted over large distances and that drive many circuits need buffering/amplification to overcome signal deterioration from capacitive loading and series resistance.

Figure 1:
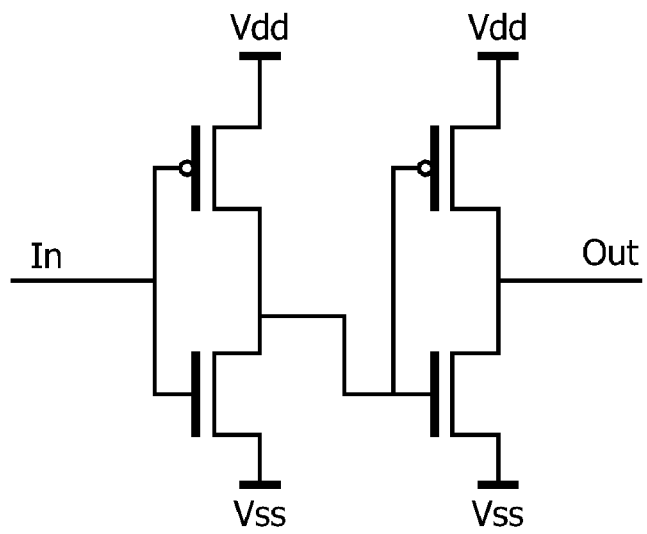

For realizing amplifiers/buffers Complementary Metal Oxide Semiconductor (CMOS) circuits are popularly used, because of their many advantages, for example, high input impedance, low output impedance, negligible static power consumption and rail-to-rail output swing. FIG. 1 shows one such amplifier/buffer having two inverters connected in series using conventional CMOS technology. The operation of this circuit is simple, transistor characteristics of inverters are chosen such that the buffer/amplifier circuit offers high input impedance and very low output impedance thereby providing a buffered/amplified output. As shown in FIG. 1 and as the name suggests, CMOS logic circuits use both N-conductivity (NMOS) as well as P-conductivity (PMOS) transistors. In many applications, it is desirable to apply only transistors of a single conductivity type in logic circuits e.g. polymer or plastic electronics, and hard disk-like solid-state memory applications.

Figure 2:
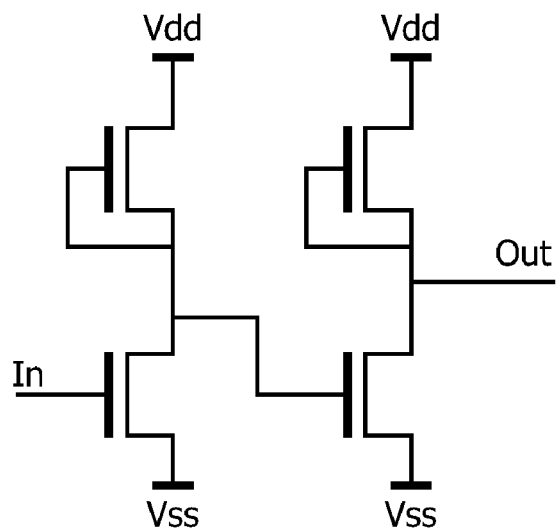

Single conductivity type logic circuits are advantageous with respect to the production/manufacturing costs of chips by reducing number of masks and lithographic processes during manufacturing. Typically single conductivity type logic uses a depletion transistor as load device. A single conductivity type buffer/amplifier using a depletion transistor is shown in FIG. 2. In this example, the single conductivity type buffer/amplifier is realized by replacing a PMOS transistor of conventional CMOS with a depletion NMOS-transistor having a negative threshold voltage. The gate of the depletion transistor is connected to its source. The two NMOS transistors on the bottom have a positive threshold voltage and function as switches. The two NMOS transistors on the top have a negative threshold voltage and function as a current source. By proper dimensioning of the components, the output signal Out provides a buffered version of the input signal. This circuit has high static power dissipation. In addition the circuits may still not offer manufacturing cost advantages as fabricating depletion or enhancement transistors on chip requires a higher number of masking and lithographic processes. Furthermore, this circuit will not work when negative threshold devices are not available in the process, because the two top devices would not conduct any substantial current.

Figure 3:
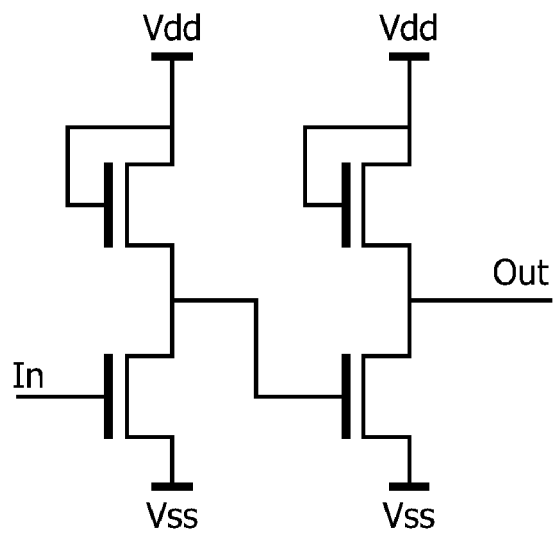

Replacing a depletion/enhancement transistor by a conventional transistor connected in a diode mode, as shown in FIG. 3, may solve problems relating to depletion/enhancement manufacturing cost. The diode-connected transistors may have a positive threshold like their counterpart, so that the inverter is provided as a single threshold, single conductivity type logic. The two transistors on the top halve of the inverter are dimensioned to be of substantially weaker conductivity than the corresponding bottom transistors, which allows the output to reach a sufficiently low voltage near circuit ground. Connecting top transistors of the inverters in a diode connect-mode allows having transistors with similar characteristics fabricated on the chip. Therewith a single threshold and single conductivity type of circuit is provided, which requires a reduced number of masking steps in the manufacturing process.

With this circuit, rail-to-rail output is a problem. As apparent from the FIG. 3, the output of the inverters will reach a maximum value of $V_{dd}-V_T$ where $V_T$ is the threshold voltage of the diode-connected transistors in the inverters. According to normal industry standards and technical requirements threshold voltage is roughly chosen about ¼ of $V_{dd}$. This threshold voltage is minimally required in order to reduce sub-threshold leakage current to a sufficiently low level when the transistor is switched off. This means that the maximum value at which the output can reach is only around ¾$V_{dd}$, which may not be enough to fully open a transistor in a next logic gate coupled to the output of FIG. 3. Therefore, relatively smaller output range, limits the cascading of this type of circuits, which is a major disadvantage. In addition, this circuit has very large power dissipation, because the second stage draws a large quiescent current when the input signal In and output signal Out are low, and the first stage draws a large quiescent current when the input signal In and output signal Out are high.

Figure 4:
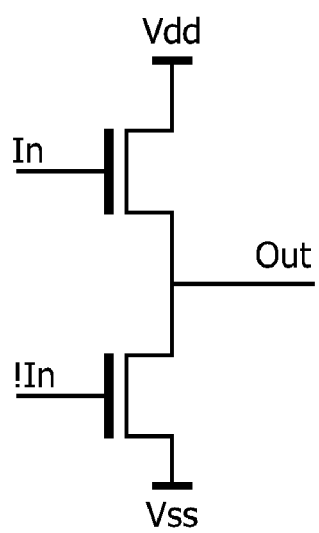

The problem of the relatively large quiescent current may be solved by providing complementary input signals to both the transistors in a circuit as shown in FIG. 4. This arrangement certainly reduces the quiescent current to a mere leakage current. The requirement of complementary input signals is a disadvantage of this circuit. Also in this case a full swing of the output signal is not obtained. This arrangement provides output swing maximum up to high voltage of the input signal In minus the threshold voltage (enlarged by the back gate effect). This reduces the usefulness of this circuit even further and makes it almost impossible to cascade.

Additionally it is remarked that all the above described amplifiers/buffers have a substantially rise and falling time, thus do not provide steep rising and falling edges.

Thus, there is a need of a single threshold and single conductivity type buffer/amplifier, which offers a reduced power dissipation and rail-to-rail output.

To this end, the invention provides an amplifier/buffer composed from circuit elements of a single threshold and single conductivity type, comprising; an input stage for receiving one or more input signals for buffering/amplification and providing a intermediate signal to control the output of said amplifier/buffer; a boosting circuit configured to boost said intermediate signal when said signal has exceeded a predetermined value, and; an output stage for providing an amplified/buffered output in response to at least the intermediate signal.

The amplifier/buffer is provided with a boosting circuit for enabling a full swing of the output. This aspect of the invention enables a rail-to-rail output in an amplifier/buffer that uses only single threshold and single conductivity type circuit elements. Using single conductivity and single threshold type circuit elements, reduces the number of masking steps, and therewith the manufacturing cost of the amplifier/buffer. The amplifier/buffer may be realized using circuit elements that are either of P-conductivity type or N-conductivity type.

According to another aspect the boosting circuit comprises; an energy storage facility arranged to store energy during an operational phase of said amplifier/buffer and to discharge the stored energy to boost said signal when the signal has exceeded the predetermined value, and; an identification circuit for identifying the operational phase and the value of the signal and, for selectively enabling boosting of the signal or storing energy. According to yet another aspect of the invention the predetermined value is identified as a voltage identified by the identification circuit to identify a state of the output of the amplifier/buffer. I.e. a first and a second polarity of the value of the intermediate signal correspond to a first and a second state of the output respectively.

This aspect of the invention enables the boosting circuit to store energy and discharge it when desired. The storage facility according to the invention may be any storage facility that may store electric energy, including capacitors and inductors. The storage facility is made of a single conductivity and single threshold type element/s. One or more elements may be combined together to form a storage facility. According to one example the storage facility may comprise a plurality of capacitors. The plurality of capacitors may be coupled to one another in series or parallel or anti-parallel mode. The identification circuit is a circuit that enables identification of operational phase of the amplifier/buffer. The identification circuit may be a smart circuit that identifies rising edges of input signals and accordingly initiates storing or boosting operation. The identification circuit alternatively may be a comparator circuit.

According to yet another aspect the boosting circuit further comprises, a current source configured to sink a current. A reference voltage, provided by a reference voltage generator, may optionally control the current source. The reference voltage generator may be an external or an internal voltage generator.

This aspect of the invention provides a boosting circuit that enables a step of storing energy into the energy storage facility and a boosting step for boosting the intermediate signal that is an indication of state of the output of the amplifier/buffer. Further this aspect provides a voltage reference generator with said boosting circuit that may be built with the amplifier/buffer. Alternatively the amplifier/buffer may be enabled for receiving said reference voltage from an external source. Further the reference voltage controls the current through the current sink. Hence, said voltage is chosen such that it enables the current source to sink only an identified amount of current to sink through the current source. Any more current than said identified amount of current causes an increase in voltage at one end of said current source.

According to one another aspect the output stage comprises a circuit for receiving at least the intermediate signal and selectively enabling an identified state of an output of said amplifier/buffer indicated by the intermediate signal. This aspect of the invention allows providing a circuitry that provides a full swing amplified/buffered output signal. Further this aspect allows coupling of one or more pulling down circuitries in case the amplifier/buffer uses more than two clock signals and it is desirable to have the output pulled strongly at the ground or at $V_{dd}$ for more than one clock signal. Similarly it also allows coupling more than one pulling up circuitry.

The input stage, output stage and the boosting circuit may be provided with circuitry for protecting elements from voltage overshoot due to boosting or otherwise.

These and other aspects of the invention are described in more detail with reference to the drawing. Therein, FIG. 1 shows a standard CMOS buffer/amplifier circuit having two inverters, FIG. 2 shows a standard circuit for single conductivity type buffer/amplifier, using depletion transistors, FIG. 3 shows a single conductivity and single threshold type buffer/amplifier, using transistors in diode connection mode, FIG. 4 shows a single conductivity and single threshold type buffer/amplifier, receiving complementary inputs, FIG. 5 shows a block diagram of single conductivity and single threshold type buffer/amplifier, according to this invention, FIG. 6 shows a detailed block diagram of single conductivity and single threshold type buffer/amplifier according to this invention, FIG. 7 shows a detailed circuit diagram of single conductivity and single threshold type buffer/amplifier according to this invention, Instant circuit is described for clock signals ClkA and ClkB which may have complementary, and partially overlapping edges, however, a person skilled in the art will appreciate that the buffer/amplifier shown is not limited to only clock signals, but that it is applicable to any input signal.

Reference to FIGS. 1, 2, 3 and 4 has already been made in previous discussion.

Figure 5:
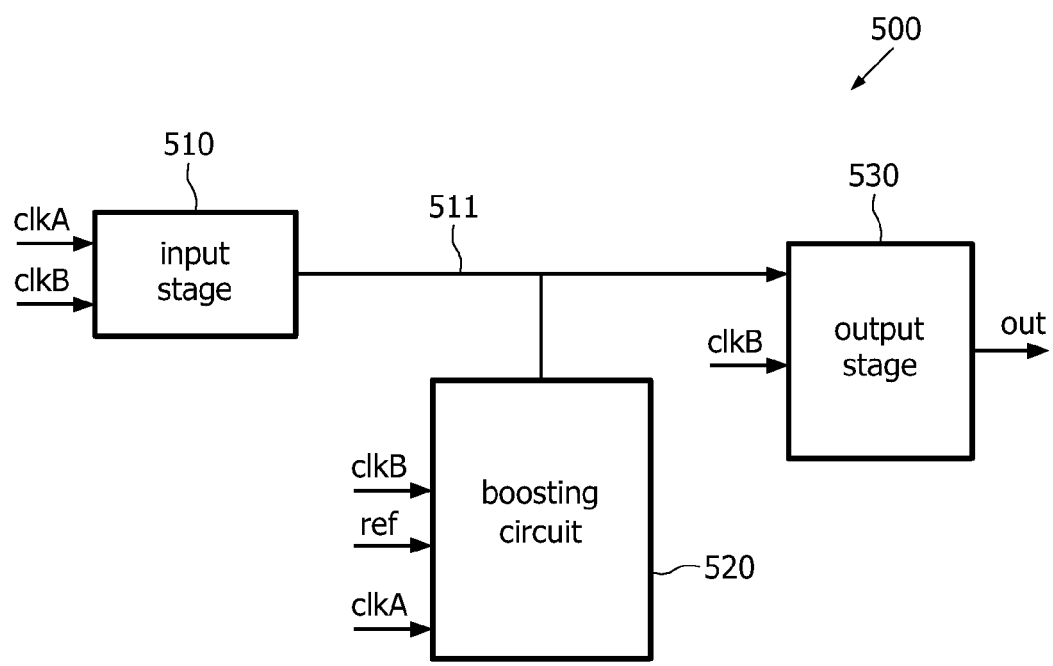

Reference is now made to FIG. 5, which shows a block diagram 500 of single conductivity and single threshold type buffer/amplifier, according to this invention. The amplifier/buffer of the invention is composed of an input stage 510 for receiving one or more input signals clkA, clkB for buffering/amplification. The input stage 510 provides an intermediate signal 511 that controls a state of the output of said amplifier/buffer. The intermediate signal 511 is provided to a boosting circuit 520. The boosting circuit 520 receives one or more input signals clkA, clkB and ref. The boosting circuit 520 is configured to identify the operational phase of the amplifier/buffer and selectively boost intermediate signal 511 when said signal 511 has exceeded a predetermined value. The amplifier/buffer further has an output stage 530 that receives at least said signal and enables an amplified/buffered output. The output stage may also receive one or more input signals ClkB for enabling state of output, that may be complementary/matching to said identified state of output, identified/controlled by the intermediate signal 511. Operation of the circuit may be understood as follows, the input stage 510 receives input signals clkA, clkB that are to be buffered or amplified and, provides an intermediate signal 511 indicative of the desired state of the output of the amplifier/buffer. This intermediate signal 511 is received by the boosting circuit 520 and the output stage 530. The boosting circuit 520 identifies, operational phase of the circuit and selectively enables the boosting of the signal 511. The selection for boosting the signal is made accordingly, if the value of signal 511 exceeds a predetermined value. The output stage 530 provides an amplified/buffered signal on receipt of the boosted intermediate signal 511. Operation of the circuit will become clearer in the subsequent discussion.

Figure 6:
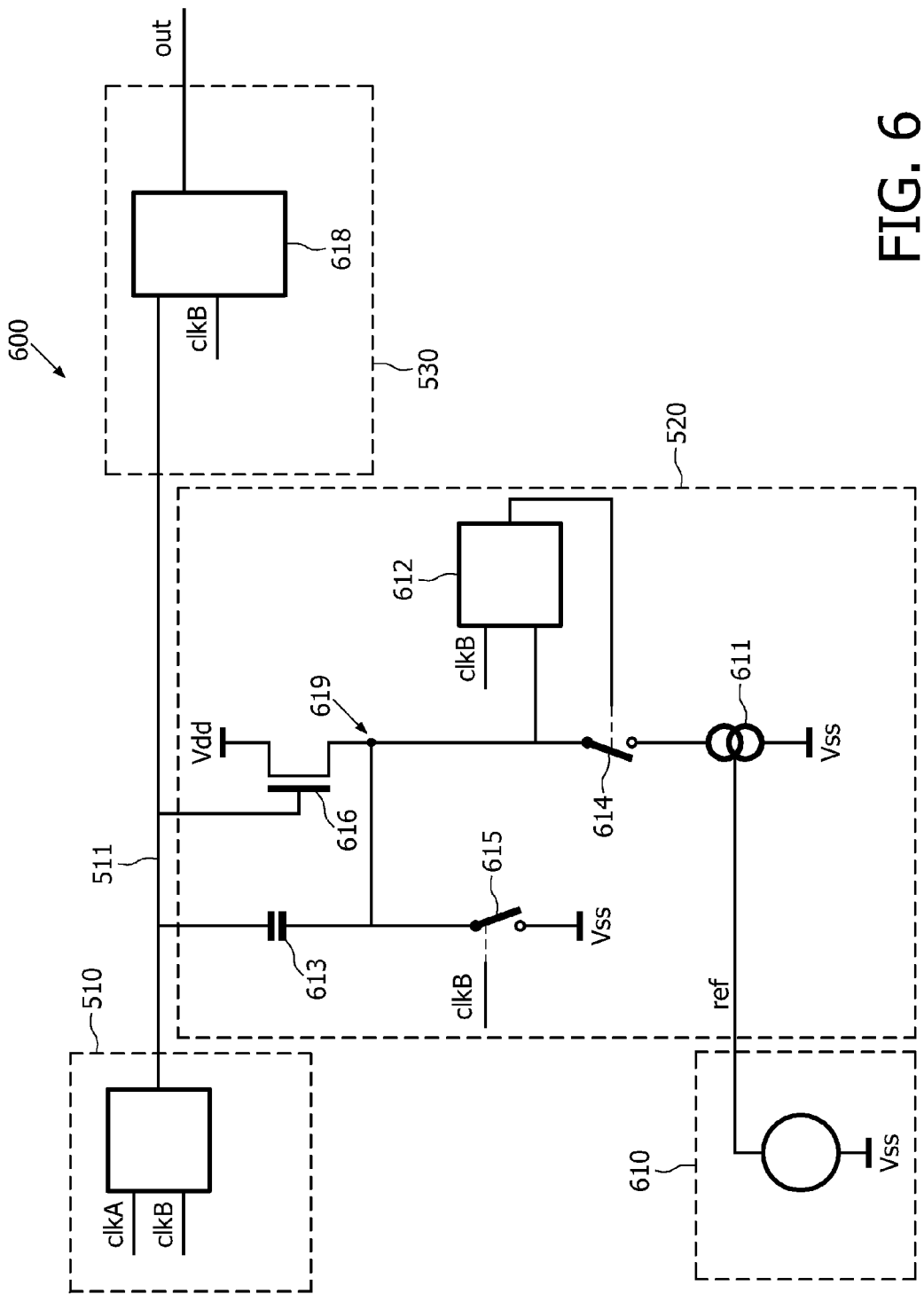
Figure 7:
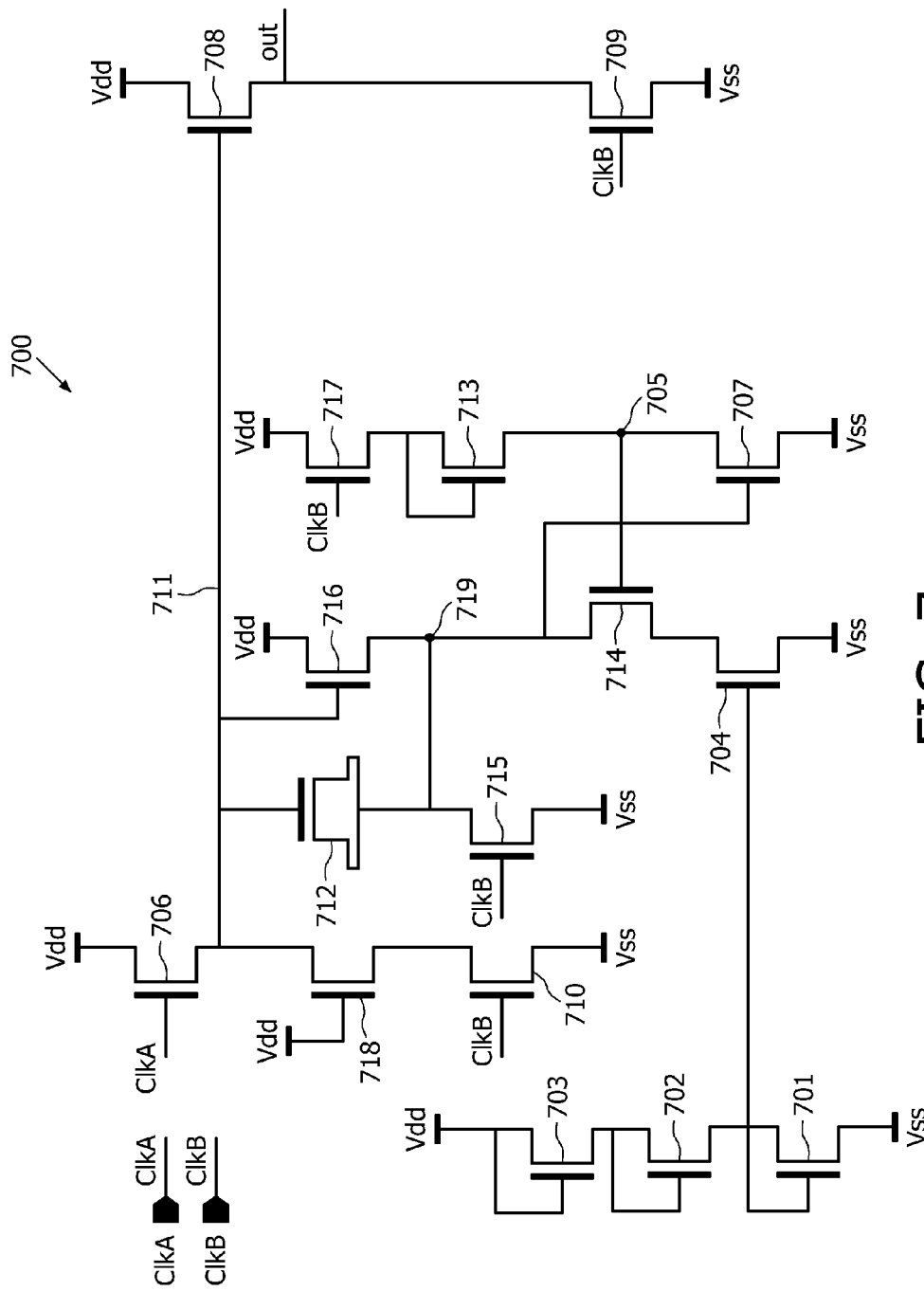

Reference is now made to FIG. 6, which shows a detailed block diagram 600 of one of the possible embodiments according to this invention. In this embodiment clock signals clkA and clkB, which have complementary, and partially overlapping edges, are used for buffering/amplifying for their identified edges. However, a person skilled in the art will appreciate that the embodiments of the invention are not limited for use with these clock signals only.

In this example, for illustration an amplifier/buffer is shown that is responsive to rising edge of the clkA and rising edge of clock signal clkB, i.e. the rising edge of the output of the amplifier/buffer follows the rising edge of the clock signal clkA and falling edge of the output of the amplifier/buffer follows the rising edge of clock signal clkB.

The amplifier/buffer according to this embodiment has basic blocks 510, 520 and 530 of FIG. 5. Additionally a reference voltage generator 610 is coupled with block boosting circuit 520. The boosting circuit 520 has a current source 611 controlled by the reference voltage generator 610, the controlling signal (reference voltage ref) of the current source is chosen such that the current source 611 sinks a predetermined current. Further the boosting circuit 520 has an energy storing facility 613 and an identification circuit 612 that identifies the phase of operation and facilitates storing of energy into energy storing facility 613 or boosting of intermediate signal 511 through the switch 614. It is to be noted that the reference voltage ref may be received from an external source or may also be received by providing a voltage generator with the amplifier/buffer. The output stage 530 has a block 618 for receiving clock signal clkB and signal 511. The operation of the circuit may be understood as follows.

The input stage 510 receives clock signals clkA and clkB and selectively provides a signal 511 that responds to either rising edge of clkA or rising edge of clkB. At a rising edge of clkA, block 510 provides an intermediate signal 511 indicating that the desired state of the output of the amplifier/buffer is high. At this point of time consider boosting circuit 520. A high signal 511 switches on the switch 616 and clock signal clkB switches off the switch 615. Now, if at the time of switching on the circuit the switch 614 initially was in on state then, the energy storage facility 613 starts storing energy through the signal line carrying intermediate signal 511 and switch 614. A current starts flowing through the current source 611. The current source 611 is configured to sink a limited amount of current. Therefore an increase of voltage at node 619 is observed, which is identified by the identifying circuit 612. In response thereto the identifying circuit switches off the switch 614, coupling the energy storing facility to $V_{dd}$ through transistor 616, which boost the intermediate signal 511 by pushing charge stored in storage facility 613 into the intermediate signal line 511. The output stage 530 receives clock signal clkB, and the intermediate signal 511. On receipt of the boosted intermediate signal 511 the output stage provides a buffered/amplified output and for rising edge of clock signal clkB it pulls down the output signal. It is to be noted that the output block may be provided with additional circuitry for realizing an amplifier/buffer that allows its application in a circuit utilizing multiple overlapping clock signals, such as one, which has been described in the pending patent application [1].

Reference is now made to FIG. 7, which shows an explicit circuit diagram 700 of an amplifier/buffer realized using single conductivity and single threshold type circuit elements according to this invention. The transistors 701, 702 and 703 form a reference voltage generator. The reference voltage provided by the reference voltage generator is supplied to the gate of transistors 704. Therewith this transistor functions as a current source. In the case when node 719 is at ground level and clkA goes high, then signal 711 starts rising high via transistor 706. However at this point the transistor 716 is not conducting as its gate 711 is below threshold. Now, suppose node 705 has been pre-charged to a high value at the time of turning on the circuit or during a previous clock cycle, and then transistor 714 is in the on-state. This results in charging of energy storing facility 712 via transistors 706 and 714 and current source 704. When the signal 711 reaches above the threshold voltage of the transistors 716, it starts conducting resulting in increased current flow through the transistor 714 and current source 704. The current source 704 is designed to sink a current, which is less than the current that flows through the transistor 716 resulting in an increase of the voltage at node 719. An increased voltage at 719 turns on transistor 707 and discharges node 705 to ground and thus transistor 714 is switched off. At this point the energy storage facility 712 is charged, and transistor 716 is conducting, therewith pulling the voltage on node 719 further towards $V_{dd}$. Because of the capacitive coupling by the charged energy storage facility (capacitor) 712, node 711 rises above $V_{dd}$, pulling open transistor 708 completely. In this state transistor 708 provides a full swing of output out towards the high voltage supply level $V_{dd}$. This completes the rising edge of the output pulse. The falling edge of the output pulse is controlled by the rising edge of the second input signal clkB that may partly overlap with the falling edge of input clock signal clkA. When clkA falls and clkB rises, transistor 706 stops conducting. The signal 711 is pulled to ground by transistors 718 and 710. The output out is pulled low via transistor 709. Also node 719 is pulled to ground by transistor 715. At the same time, node 705 is charged via transistor 717. Note that diode-connected transistor 713 is for timing tuning purposes only. This explains both rising and falling edge of the amplifier/buffer.

In the above discussion an embodiment of the invention using N-conductivity type elements are explained. A person skilled in the art will appreciate that an alterative embodiment using P-conductivity type elements is equally possible. The preceding explanation applies analogously to said alternative embodiments.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of software by means of a suitably programmed computer. In the system claims enumerating several means, several of these means can be embodied by one and the same item of computer readable software or hardware.

REFERENCE

[1] European Patent Application number 05108653.6.

The invention claimed is:

1. An amplifier/buffer composed from circuit elements of a single threshold and single conductivity type, comprising:
an input stage for receiving one or more input signals for buffering/amplification and providing an intermediate signal to control the output of said amplifier/buffer;
a boosting circuit configured to boost the intermediate signal when said signal has exceeded a predetermined value wherein said boosting circuit comprises: an energy storage facility arranged to store energy during an operational phase of said amplifier/buffer and to discharge the stored energy to boost the intermediate signal; an identification circuit for identifying the operational phase and whether the intermediate signal has exceeded the predetermined value, and for selectively enabling boosting of the signal or storing energy dependent on said identification; and
an output stage for providing an amplified/buffered output in response to at least the intermediate signal.

2. The amplifier/buffer as claimed in claim 1 wherein said output stage comprises a circuit for receiving at least the intermediate signal and selectively enabling an identified state of an output of said amplifier/buffer indicated by the intermediate signal.

3. The amplifier/buffer as claimed in claim 1 wherein said predetermined value is identified as a voltage identified by the identification circuit to identify a state of the output of the amplifier/buffer.

4. The amplifier/buffer as claimed in claim 3 wherein said boosting circuit further comprises a current source configured to sink a current, wherein the energy storing facility is charged via said current source.

5. The amplifier/buffer as claimed in claim 4 wherein said current source is controlled by a reference voltage.

6. The amplifier/buffer as claimed in claim 4 wherein said reference voltage is received from a reference voltage generator.

* * * * *